US012609171B2

(12) United States Patent
Dong et al.

(10) Patent No.: US 12,609,171 B2
(45) Date of Patent: Apr. 21, 2026

(54) MEMORY DEVICE AND OPERATION METHOD THEREOF, AND MEMORY SYSTEM

(71) Applicant: YANGTZE MEMORY TECHNOLOGIES CO., LTD., Wuhan (CN)

(72) Inventors: Zhipeng Dong, Wuhan (CN); Li Xiang, Wuhan (CN); Zhuo Chen, Wuhan (CN); Shuai Wang, Wuhan (CN); Chunyuan Hou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 184 days.

(21) Appl. No.: 18/226,191

(22) Filed: Jul. 25, 2023

(65) Prior Publication Data

US 2024/0355399 A1     Oct. 24, 2024

Related U.S. Application Data

(63) Continuation of application No. PCT/CN2023/089924, filed on Apr. 21, 2023.

(51) Int. Cl.
*G11C 16/34*          (2006.01)
*G11C 16/16*          (2006.01)

(52) U.S. Cl.
CPC .......... *G11C 16/3445* (2013.01); *G11C 16/16* (2013.01)

(58) Field of Classification Search
CPC ............................ G11C 16/3445; G11C 16/16
USPC ..................................... 365/185.22
See application file for complete search history.

(56) References Cited

U.S. PATENT DOCUMENTS

| | | | | |
|---|---|---|---|---|
| 2018/0130535 | A1* | 5/2018 | Lee .................... | G11C 16/3445 |
| 2020/0111535 | A1* | 4/2020 | Han ........................ | G11C 16/16 |
| 2021/0050066 | A1* | 2/2021 | Han ........................ | G11C 16/16 |
| 2022/0223210 | A1* | 7/2022 | Huang .................... | G11C 16/10 |
| 2024/0395331 | A1* | 11/2024 | Huang ............... | G11C 16/3445 |

* cited by examiner

*Primary Examiner* — Amir Zarabian
*Assistant Examiner* — Daniel John King
(74) *Attorney, Agent, or Firm* — BAYES PLLC

(57)          ABSTRACT

Implementations of the present disclosure provide a memory device, an operation method thereof, and a memory system. The memory device may include a memory cell array including a plurality of blocks. The memory device may include a peripheral circuit coupled to the memory cell array. The peripheral circuit may be configured to apply a plurality of different erasure verification voltages to a selected block among the plurality of blocks after applying a first effective erasure voltage to the selected block. The peripheral circuit may be configured to determine a second effective erasure voltage applied to the selected block according to a plurality of erasure verification results corresponding to the plurality of different erasure verification voltages. The second effective erasure voltage may be greater than the first effective erasure voltage.

20 Claims, 6 Drawing Sheets

<u>300</u>

300

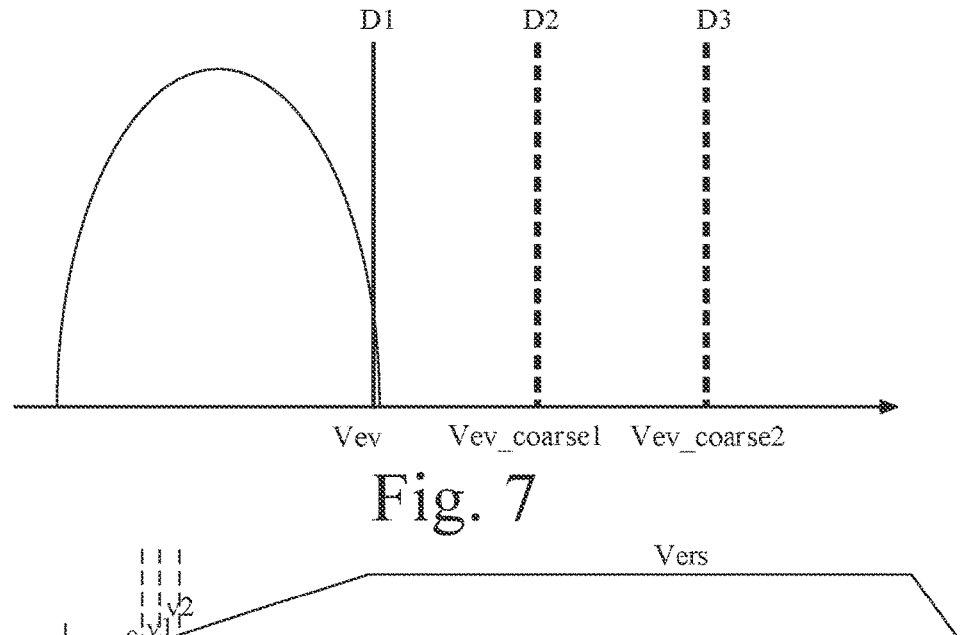
Fig. 7
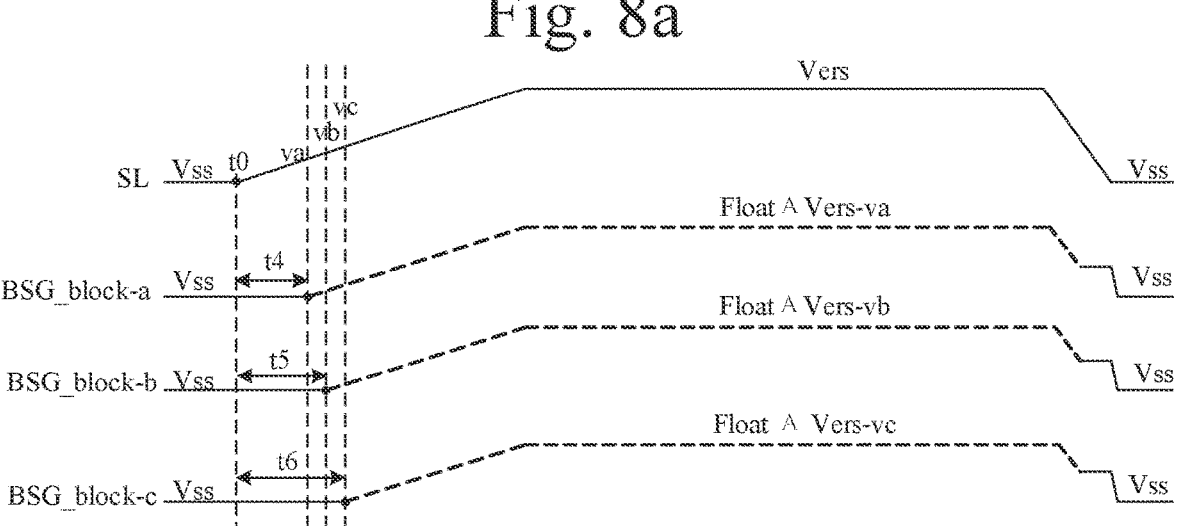
Fig. 8a
Fig. 8b

MEMORY DEVICE AND OPERATION METHOD THEREOF, AND MEMORY SYSTEM

CROSS-REFERENCE TO RELATED APPLICATIONS

This application is a continuation of International Application No. PCT/CN2023/089924, filed on Apr. 21, 2023, which is incorporated herein by reference in its entirety.

TECHNICAL FIELD

The present application relates to the field of semiconductor technologies, and relates to but not limited to a memory device and an operation method thereof, and a memory system.

BACKGROUND

A memory device is a storage device used to preserve information in modern information technology. NAND (Not-And) memory, as a typical non-volatile semiconductor memory, has gradually become a mainstream products in the storage market due to its high storage density, controllable production cost, suitable programming and erasing speed and retention characteristics.

SUMMARY

In view of above, implementations of the present disclosure propose a memory device, an operation method thereof, and a memory system.

According to one aspect of the present disclosure, a memory device is provided. The memory device may include a memory cell array that includes a plurality of blocks. The memory device may include a peripheral circuit coupled to the memory cell array. The peripheral circuit may be configured to apply a plurality of different erasure verification voltages to a selected block among the plurality of blocks after applying a first effective erasure voltage to the selected block. The peripheral circuit may be configured to determine a second effective erasure voltage applied to the selected block according to a plurality of erasure verification results corresponding to the plurality of different erasure verification voltages. The second effective erasure voltage may be greater than the first effective erasure voltage.

In an implementation, the plurality of different erasure verification voltages may include three different erasure verification voltages. In an implementation, the plurality of erasure verification results may include three erasure verification results.

In an implementation, the three different erasure verification voltages may include a first erasure verification voltage, a second erasure verification voltage, and a third erasure verification voltage whose voltage values increase sequentially. In an implementation, the first erasure verification voltage, the second erasure verification voltage and the third erasure verification voltage may respectively correspond to the first erasure verification result, the second erasure verification result and the third erasure verification result.

In an implementation, the peripheral circuit may be further configured to, when the first erasure verification result fails and the second erasure verification result is successful, determine that the voltage value of the second effective erasure voltage is increased by a first voltage increment greater than the voltage value of the first effective erasure voltage. In an implementation, the peripheral circuit may be further configured to, when the second erasure verification result fails and the third erasure verification result is successful, determine that the voltage value of the second effective erasure voltage is increased by a second voltage increment greater than the voltage value of the first effective erasure voltage. In an implementation, the peripheral circuit may be further configured to, when the third erasure verification result fails, determine that the voltage value of the second effective erasure voltage is increased by a third voltage increment greater than the voltage value of the first effective erasure voltage. In an implementation, the third voltage increment is greater than the second voltage increment, and the second voltage increment is greater than the first voltage increment.

In an implementation, the block includes a drain terminal and a source terminal, the source terminal being provided with a source line and a source select gate. In an implementation, the peripheral circuit may be further configured to apply a pulse corresponding to a first erasure voltage to the source line of the selected block. In an implementation, the peripheral circuit may be further configured to during a voltage of the source line rising to the first erasure voltage, apply a first voltage to the source select gate of the selected block and float the source select gate after a preset duration. In an implementation, the peripheral circuit may be further configured to during the voltage of the source line being stabilized at the first erasure voltage, stabilize a voltage of the source select gate at a second voltage. In an implementation, the second voltage may be lower than the first erasure voltage, and the difference between the first erasure voltage and the second voltage constitutes the second effective erasure voltage. In an implementation, the longer the preset duration is, the larger the voltage value of the second effective erasure voltage.

In an implementation, the peripheral circuit may be further configured to, when the first erasure verification result fails and the second erasure verification result is successful, determine that the preset duration is a first duration. In an implementation, the peripheral circuit may be further configured to, when the second erasure verification result fails and the third erasure verification result is successful, determine that the preset duration is a second duration. In an implementation, the peripheral circuit may be further configured to, when the third erasure verification result fails, determine that the preset duration is a third duration. In an implementation, the first duration may be shorter than the second duration, and the second duration may be shorter than the third duration.

In an implementation, the selected block may include a plurality of blocks. In an implementation, the peripheral circuit may be configured to apply a pulse corresponding to the first erasure voltage to the source line of each block in the selected plurality of blocks simultaneously.

In an implementation, the memory cell array may include a plurality of memory planes; the selected plurality of blocks are respectively stored in different memory planes. In an implementation, the peripheral circuit may be further configured to apply the different second effective erasure voltage to the selected plurality of blocks in different memory planes by changing the preset duration when performing an erase operation on the selected plurality of blocks in a plurality of memory planes.

In an implementation, the block includes a drain terminal and a source terminal, the source terminal is provided with a source line, and the block includes a plurality of word lines located between the drain terminal and the source terminal. In an implementation, the peripheral circuit may be further configured to apply a second erasure voltage to the source line of the selected block. In an implementation, the peripheral circuit may be further configured to apply a first voltage to all word lines of the selected block, a difference between the second erasure voltage and the first voltages constitutes the second effective erasure voltage. In an implementation, the greater a voltage value of the second erasure voltage is, the greater the voltage value of the second effective erasure voltage.

In an implementation, the first voltage may be a ground voltage.

In one implementation, the peripheral circuit may be further configured to perform an erase operation on the selected block by applying a gradually increasing effective erasure voltage multiple times. In one implementation, the peripheral circuit may be further configured to apply the third erasure verification voltage to the selected block directly after applying an effective erasure voltage each time within preset times. In one implementation, the peripheral circuit may be further configured to, based on the erasure verification result corresponding to the third erasure verification voltage, determine the effective erasure voltage to be applied to the selected block next time. In one implementation, the peripheral circuit may be further configured to apply the plurality of different erasure verification voltages to the selected block after applying the effective erasure voltage each time beyond the preset times. In one implementation, the peripheral circuit may be further configured to, based on a plurality of the erasure verification results corresponding to the plurality of different erasure verification voltages, determine the effective erasure voltage to be applied to the selected block next time.

In an implementation, the peripheral circuit may be further configured to apply the second erasure verification voltage to the selected block when the first erasure verification result fails. In an implementation, the peripheral circuit may be further configured to apply the third erasure verification voltage to the selected block when the second erasure verification result fails.

In an implementation, the first voltage increment may be a step voltage.

According to another aspect of the present disclosure, a memory system is provided. The memory system may include one or more memory devices as described in the above implementations of the present disclosure. The memory system may include a memory controller coupled to the memory device and controlling the memory device.

According to a further aspect of the present disclosure, a method of operating a memory device is provided. The method may include applying a plurality of different erasure verification voltages to a selected block of the memory device after applying a first effective erasure voltage to the selected block. The method may include determining a second effective erasure voltage applied to the selected block according to a plurality of erasure verification results corresponding to the plurality of different erasure verification voltages. In an implementation the second effective erasure voltage may be greater than the first effective erasure voltage.

In an implementation, the plurality of different erasure verification voltages may include three different erasure verification voltages. In an implementation, the plurality of erasure verification results may include three erasure verification results.

In an implementation, the three different erasure verification voltages may include a first erasure verification voltage, a second erasure verification voltage, and a third erasure verification voltage whose voltage values increase sequentially. In an implementation, the first erasure verification voltage, the second erasure verification voltage, and the third erasure verification voltage respectively correspond to the first erasure verification result, the second erasure verification result and the third erasure verification result. In an implementation, the method may include, when the first erasure verification result fails and the second erasure verification result is successful, determining that the voltage value of the second effective erasure voltage is increased by a first voltage increment greater than the voltage value of the first effective erasure voltage. In an implementation, the method may include, when the second erasure verification result fails and the third erasure verification result is successful, determining that the voltage value of the second effective erasure voltage is increased by a second voltage increment greater than the voltage value of the first effective erasure voltage. In an implementation, the method may include, when the third erasure verification result fails, determining that the voltage value of the second effective erasure voltage is increased by a third voltage increment greater than the voltage value of the first effective erasure voltage. In an implementation, the third voltage increment may be greater than the second voltage increment, and the second voltage increment is greater than the first voltage increment.

In an implementation, the block may include a drain terminal and a source terminal, the source terminal being provided with a source line and a source select gate. In an implementation, the method may include applying a pulse corresponding to a first erasure voltage to the source line of the selected block. In an implementation, the method may include, during a voltage of the source line rising to the first erasure voltage, applying a first voltage to the source select gate of the selected block and float the source select gate after a preset duration. In an implementation, the method may include, during the voltage of the source line being stabilized at the first erasure voltage, stabilizing a voltage of the source select gate at a second voltage. In an implementation, the second voltage may be lower than the first erasure voltage. In an implementation, the difference between the first erasure voltage and the second voltage may constitute the second effective erasure voltage. In an implementation, the longer the preset duration is, the larger the voltage value of the second effective erasure voltage.

In an implementation, the method may include, when the first erasure verification result fails and the second erasure verification result is successful, determining that the preset duration is a first duration. In an implementation, the method may include, when the second erasure verification result fails and the third erasure verification result is successful, determining that the preset duration is a second duration. In an implementation, the method may include, when the third erasure verification result fails, determining that the preset duration is a third duration. In an implementation, the first duration may be shorter than the second duration. In an implementation, the second duration may be shorter than the third duration.

In an implementation, the block may include a drain terminal and a source terminal, the source terminal is provided with a source line. In an implementation, the block may include a plurality of word lines located between the drain terminal and the source terminal. In an implementation, the method may further include applying a second erasure voltage to the source line of the selected block. In an implementation, the method may further include applying a first voltage to all word lines of the selected block, a difference between the second erasure voltage and the first voltages constitutes the second effective erasure voltage. In an implementation, the greater a voltage value of the second erasure voltage is, the greater the voltage value of the second effective erasure voltage.

In an implementation, the method may further include performing an erase operation on the selected block by applying a gradually increasing effective erasure voltage multiple times. In an implementation, the method may further include applying the third erasure verification voltage to the selected block directly after applying an effective erasure voltage each time within preset times. In an implementation, the method may further include, based on the erasure verification result corresponding to the third erasure verification voltage, determining the effective erasure voltage to be applied to the selected block next time. In an implementation, the method may further include applying the plurality of different erasure verification voltages to the selected block after applying the effective erasure voltage each time beyond the preset times. In an implementation, the method may further include, based on a plurality of the erasure verification results corresponding to the plurality of different erasure verification voltages, determining the effective erasure voltage to be applied to the selected block next time.

Implementations of the present disclosure propose a memory device, operation method thereof, and a memory system. The memory device may include a memory cell array and a peripheral circuit. In an implementation, the memory cell array may include a plurality of blocks. In an implementation, the peripheral circuit may be configured to apply a plurality of different erasure verification voltages to a selected block among the plurality of blocks after applying a first effective erasure voltage to the selected block. In an implementation, the peripheral circuit may be configured to determine a second effective erasure voltage applied to the selected block according to a plurality of erasure verification results corresponding to the plurality of different erasure verification voltages. In an implementation, the second effective erasure voltage may be greater than the first effective erasure voltage. In an implementation of the present disclosure, after applying the first effective erasure voltage to each selected block among the plurality of blocks, the erasing extent of each block may be determined by applying multiple different erasure verification voltages to the plurality of blocks respectively. In an implementation, based the different erasing extents of multiple blocks, different second effective erasure voltages may be applied thereto, so that the erasing extents of the plurality of blocks after applying different second effective erasure voltages tend to be consistent, and the erasing speeds may be consistent. Thus, the threshold voltage distributions in the erased states among different blocks may be uniform and consistent, and the read window margin of the block is increased, thereby improving the read and erase performances of the memory device.

BRIEF DESCRIPTION OF THE DRAWINGS

FIG. 7 is an example schematic diagram including applying three different erasure verification voltages to a block provided by an implementation of the present disclosure.

FIG. 8a is an example schematic diagram including applying different second voltages to multiple blocks provided by an implementation of the present disclosure.

FIG. 8b is another example schematic diagram including applying different second voltages to multiple blocks provided by an implementation of the present disclosure.

Figure 1:
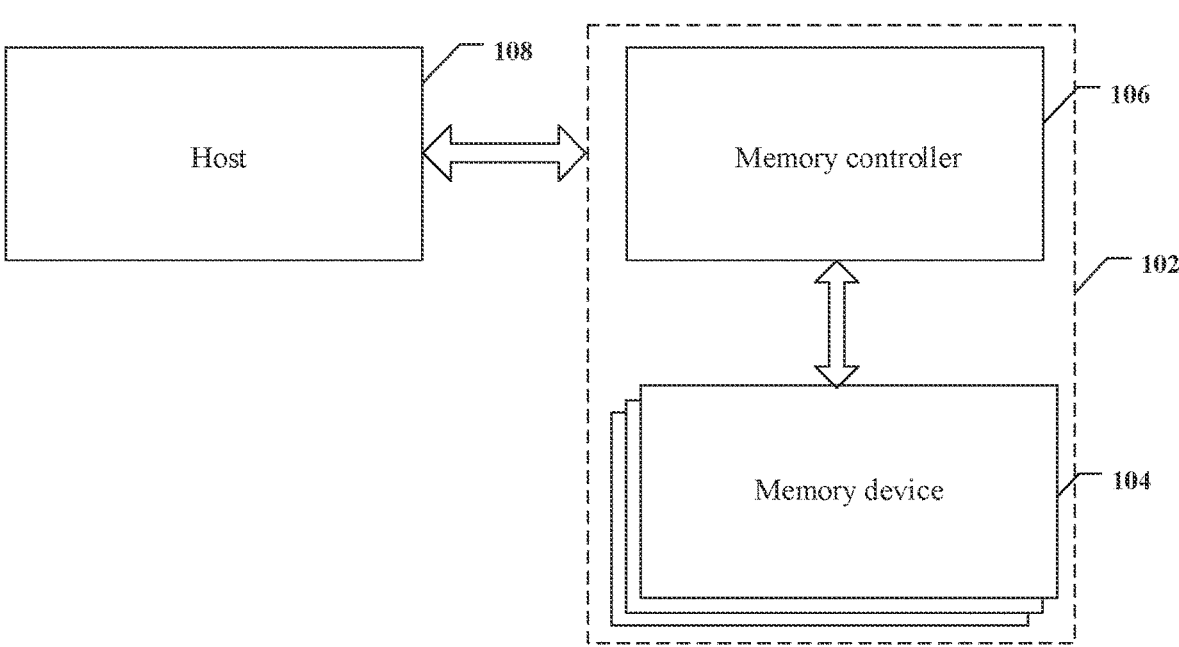
FIG. 1 is a schematic diagram of an example system with a memory system according to an implementation of the present disclosure.

In the above drawings (which are not necessarily drawn to scale), like reference numerals may describe like parts in the different views. Similar reference numbers with different letter suffixes may indicate different examples of similar components. The drawings generally illustrate the various implementations discussed herein, by way of example and not limitation.

DETAILED DESCRIPTION

Example implementations of the present disclosure will be described in more detail below with reference to the accompanying drawings. Although example implementations of the present disclosure are shown in the drawings, it should be understood that the present disclosure may be implemented in various forms and should not be limited to the specific implementations set forth herein. Rather, these implementations are provided so that the present disclosure can be more thoroughly understood and the scope of the present disclosure can be fully conveyed to those skilled in the art.

In the following description, numerous specific details are given in order to provide a more thorough understanding of the present disclosure. It will be apparent, however, to one skilled in the art that the present disclosure may be practiced without one or more of these details. In other instances, some technical features well-known in the art are not described to avoid confusion with the present disclosure;

that is, not all features of the actual implementation are described here, and well-known functions and structures are not described in detail.

In the drawings, the size of layers, regions, elements and their relative sizes may be exaggerated for clarity. Like reference numerals refer to like elements throughout.

It will be understood that when an element or layer is referred to as being "on," "adjacent to," "connected to" or "coupled to" another element or layer, it can be directly on, adjacent to, connected to, or coupled to other elements or layers, or intervening elements or layers may be present. In contrast, when an element is referred to as being "directly on," "directly adjacent to," "directly connected to" or "directly coupled to" another element or layer, there are no intervening elements or layers present. It will be understood that, although the terms such as first, second, third etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure. When a second element, component, region, layer or section is discussed, it does not indicate that a first element, component, region, layer or section necessarily exists in the present disclosure.

Spatial terms such as "under", "below", "beneath", "underneath", "on", "above" and so on, can be used here for convenience to describe the relationship of one element or feature to other elements or features shown in the figures. It will be understood that the spatially relative terms are intended to encompass different orientations of the device in use and operation in addition to the orientation depicted in the figures. For example, if the device in the figures is turned over, elements or features described as "below" or "under" or "beneath" other elements or features would then be oriented "above" the other elements or features. Thus, the example terms "below" and "beneath" can encompass both orientations of above and below. The device may be otherwise oriented (rotated 90 degrees or at other orientations) and the spatial descriptors used herein may be interpreted accordingly.

The terminology used herein is for the purpose of describing particular implementations only and is not to be taken as a limitation of the present disclosure. As used herein, the singular forms "a", "an" and "said/the" are intended to include the plural forms as well, unless the context clearly dictates otherwise. It should also be understood that the terms "consists of" and/or "comprising", when used in this specification, identify the presence of stated features, integers, steps, operations, elements and/or parts, but do not exclude presence or addition of one or more other features, integers, steps, operations, elements, parts and/or groups. As used herein, the term "and/or" includes any and all combinations of the associated listed items.

In order to understand the characteristics and technical content of the implementations of the present disclosure in more detail, the implementation of the implementations of the present disclosure will be described in detail below in conjunction with the accompanying drawings. The attached drawings are only for reference and description, and are not intended to limit the implementations of the present disclosure.

The memory device in the implementations of the present disclosure includes but is not limited to a three-dimensional NAND memory, and for ease of understanding, a three-dimensional NAND memory is used as an example for illustration.

FIG. 1 shows a block diagram of an example system 100 with memory devices in accordance with some aspects of the present disclosure. System 100 may be a mobile phone, desktop computer, laptop computer, tablet computer, vehicle computer, game console, printer, pointing device, wearable electronic device, smart sensor, virtual reality (VR) device, augmented reality (AR) device or any other suitable electronic device having storage therein. As shown in FIG. 1, system 100 may include a host 108 and a memory system 102 having one or more memory devices 104 and a memory controller 106. The host 108 may be a processor (e.g., a central processing unit (CPU)) or a system on a chip (SoC) (e.g., an application processor (AP)) of an electronic device. Host 108 may be configured to send data to or receive data from memory device 104.

According to some implementations, memory controller 106 is coupled to memory device 104 and host 108 and is configured to control memory device 104. Memory controller 106 may manage data stored in memory device 104 and communicate with host 108. In some implementations, memory controller 106 is designed to operate in low duty-cycle environments such as Secure Digital (SD) cards, Compact Flash (CF) cards, Universal Serial Bus (USB) flash drives, or other media for use in electronic devices such as personal computers, digital cameras, mobile phones, and the like. In some implementations, the memory controller 106 is designed for operation in a high duty-cycle environment Solid State Disk (SSD) or embedded multimedia card (eMMC) used as data storage for mobile devices such as a smartphone, tablet computer, laptop computer, etc., and enterprise memory arrays.

The memory controller 106 may be configured to control operations of the memory device 104, e.g., such as read, erase and program operations. The memory controller 106 may further be configured to manage various functions related to data stored or to be stored in the memory device 104, including but not limited to bad block management, garbage collection, logical-to-physical address translation, wear leveling, and the like. In some implementations, memory controller 106 is further configured to process error correction code (ECC) on data read from or written to memory device 104. Memory controller 106 may further perform any other suitable functions, such as formatting memory device 104. Memory controller 106 may communicate with external devices (e.g., host 108) according to a particular communication protocol. For example, the memory controller 106 can communicate with external devices through at least one of various interface protocols, such as USB protocol, MMC protocol, Peripheral Component Interconnect (PCI) protocol, PCI Express (PCI-E) protocol, Advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

Figure 2A:
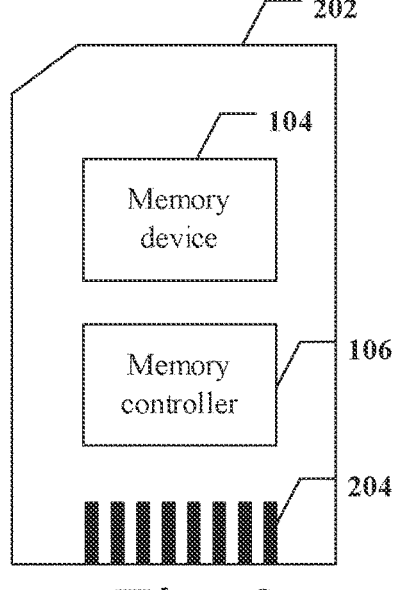
FIG. 2a is a schematic diagram of an example memory card with a memory system according to an implementation of the present disclosure.
Figure 2B:
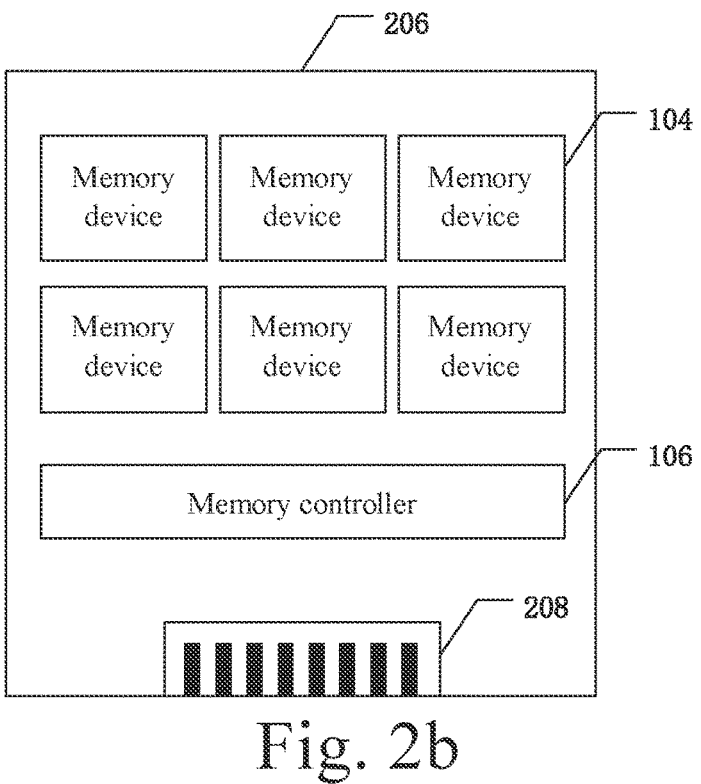
FIG. 2b is a schematic diagram of an example solid state drive with a memory system according to an implementation of the present disclosure.

The memory controller 106 and the one or more memory devices 104 may be integrated into various types of storage devices, e.g., be included in the same package (e.g., a Universal Flash Storage (UFS) package or an eMMC package). That is, the memory system 102 can be implemented and packaged into different types of terminal electronic products. In one example as shown in FIG. 2a, memory controller 106 and a single memory device 104 may be integrated into memory card 202. The memory card 202 may include a personal computer (PC) card (e.g., a Personal Computer Memory Card International Association (PCM-CIA) card), compact flash (CF) card, Smart Media (SM) card, memory stick, multimedia card (MMC) (e.g., a reduced-size (RS) MMC (RS-MMC), MMCmicro, etc.), secure digital (SD) card (e.g., miniSD, microSD, SD high-capacity (SDHC) card, etc.), universal flash (UFS), etc. The memory card 202 may further include a memory card connector 204 that couples the memory card 202 with a host (e.g., host 108 in FIG. 1). In another example, as shown in FIG. 2*b*, memory controller 106 and multiple memory devices 104 may be integrated into SSD 206. SSD 206 may further include SSD connector 208 that couples SSD 206 to a host (e.g., host 108 in FIG. 1). In some implementations, the storage capacity and/or operating speed of SSD 206 is greater than the storage capacity and/or operating speed of memory card 202.

Figure 3A:
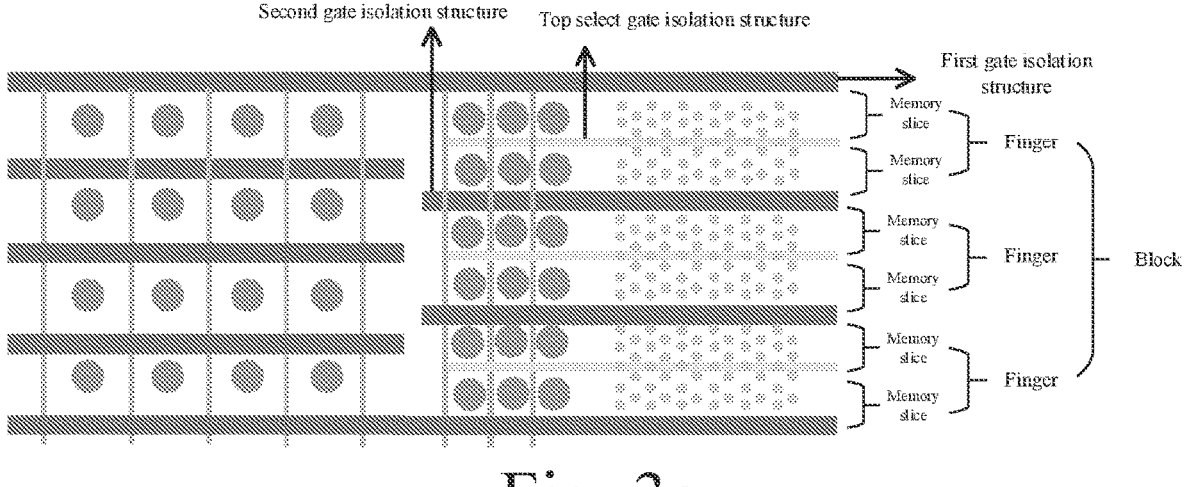
FIG. 3a is a schematic diagram of the distributions of memory cells of a three-dimensional NAND memory according to an implementation of the present disclosure.

A structural schematic diagram of a memory cell array of a three-dimensional NAND memory is given as an example in FIG. 3*a*. As shown in FIG. 3*a*, the memory cell array of a three-dimensional NAND memory may include several memory cell rows parallel to gate isolation structure and staggered in parallel. Every two rows of memory cell are separated by a gate isolation structure and a top select gate isolation structure, and each memory cell row includes a plurality of memory cells. The gate isolation structure may include a first gate isolation structure and a second gate isolation structure. The first gate isolation structure divides the memory cell array into a plurality of blocks, the plurality of second gate isolation structures may divide the blocks into multiple fingers, and the top select gate isolation structure set in the middle of each finger may divide the finger into two parts, so that the finger is divided into two memory slices. A block shown in FIG. 3*a* includes 6 memory slices, and in practical applications, the number of memory slices in a block is not limited to this.

In some implementations, each block can be coupled to multiple word lines, and multiple memory cells coupled to each individually controlled word line form a page. By way of example and not limitation, all memory cells in each memory slice in FIG. 3*a* are coupled to form a page.

It is noted that the number of memory cell rows between the gate isolation structure and the top select gate isolation structure shown in FIG. 3*a* is merely an example, and is not intended to limit or define the number of memory cell rows that one finger of three-dimensional NAND memory in the present disclosure includes. In practical applications, the number of memory cell rows included in a finger can be adjusted according to actual conditions, such as 2, 4, 8, 16, and so on.

Figure 3B:
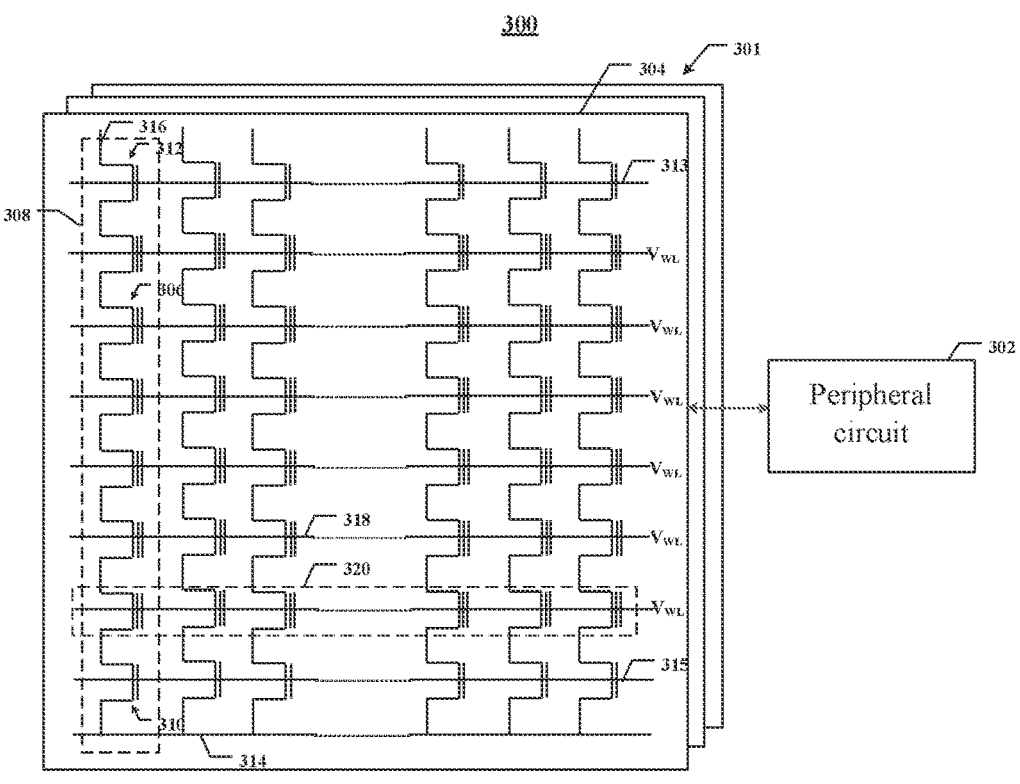
FIG. 3b is a schematic diagram of an example memory including peripheral circuits according to an implementation of the present disclosure.

FIG. 3*b* shows a schematic circuit diagram of an example memory device 300 including peripheral circuit in accordance with some aspects of the present disclosure. Memory device 300 may be an example of memory device 104 in FIG. 1. Memory device 300 may include a memory cell array 301 and peripheral circuits 302 coupled to memory cell array 301. The memory cell array 301 is illustrated as an example of a three-dimensional NAND type memory cell array, where the memory cells 306 are NAND memory cells and are provided in the form of an array of memory strings 308. Each memory string 308 may extend vertically above a substrate (not shown). In some implementations, each memory string 308 includes a plurality of memory cells 306 coupled in series and stacked vertically. Each memory cell 306 may hold a continuous analog value, e.g., such as a voltage or charge, depending on the number of electrons trapped within the area of the memory cell 306. Each memory cell 306 may be a floating-gate memory cell including a floating gate transistor, or a charge-trap memory cell including a charge trap transistor.

In some implementations, each memory cell 306 may be a Single-Level Cell (SLC) that has two possible memory states, and can thus store one bit of data. For example, a first memory state of "0" may correspond to a first voltage range, and a second memory state of "1" may correspond to a second voltage range. In some implementations, each memory cell 306 is a Multi-Level Cell (MLC) capable of storing more than a bit of data in more than four memory states. For example, MLCs can store two bits per cell (also known as Double-Level Cell), three bits-per-cell (also known as Trinary-Level Cell (TLC)), four bits per cell (also known as Quad-Level Cell (QLC)), five bits-per-cell (also known as Penta-Level Cell (PLC)) or more than five bits-per-cell. Each MLC can be programmed to assume a range of possible nominal storage values. In one example, if each MLC stores two bits of data, the MLC can be programmed to take one of three possible programming levels from the erased state by writing one of three possible nominal storage values into the cell. A fourth nominal storage value may be used for the erased state.

As shown in FIG. 3*b*, each memory string 308 may include a bottom select transistor 310 (also known as source side select transistor, including source select gate BSG) at its source terminal and a top select transistor 312 (also known as drain side select transistor, including drain select gate TSG) at its drain terminal. Source select gate BSG 310 and drain select gate TSG 312 may be configured to activate selected memory strings 308 during read and program operations. In some implementations, the sources of the memory strings 308 in the same block 304 are coupled by the same source line (SL) 314 (e.g., a common SL). In other words, according to some implementations, all memory strings 308 in the same block 304 have an array common source (ACS). According to some implementations, the TSG 312 of each memory string 308 is coupled to a corresponding bit line (BL) 316 from which data can be read or written via an output bus (not shown). In some implementations, each memory string 308 is configured to be selected or deselected by applying to corresponding TSG 312 a select voltage (e.g., higher than a threshold voltage of a transistor with TSG 312) or a deselect voltage (for example, 0V) via one or more TSG line 313, and/or, by applying to corresponding BSG 310 a select voltage (e.g., higher than a threshold voltage of a transistor with BSG 310) or a deselect voltage (for example, 0V) via one or more BSG line 315.

As shown in FIG. 3*b*, memory string 308 may be organized into multiple blocks 304, each of which may have a common source line 314 (e.g., coupled to ground). In some implementations, each block 304 is the basic unit of data for an erase operation, e.g., all memory cells 306 on the same block 304 are erased simultaneously. To erase the memory cells 306 in a selected block 304, an erasure voltage (Vers) (e.g., a high positive voltage (e.g., 20V or higher)) is bias coupled to source lines 314 of the selected block 304 and to unselected blocks 304 in the same plane as the selected block 304. It should be understood that, in some examples, erase operations may be performed at the half block level, at the quarter block level, or at a level of any suitable number of blocks or any fraction of blocks. Memory cells 306 of adjacent memory strings 308 may be coupled by word lines 318 that select which row of memory cells 306 is affected by read and program operations. In some implementations, with reference to the FIG. 3a above, the plurality of memory cells are isolated by the top select gate isolation structure and the gate isolation structure, and multiple memory cells between the top select gate isolation structure and the gate isolation structure are arranged into multiple memory cell rows, and each memory cell row is parallel to the gate isolation structure and the top select gate isolation structure. The memory cells in a memory slice sharing the same word line form a physical page 320, and each physical page 320 can be mapped to at least one logical page according to storage mode (e.g., SLC or MLC as mentioned above) of the corresponding memory cell 306. A logical page can constitute the basic data unit for program and read operations.

Referring to FIGS. 3a and 3b, each memory cell 306 of the plurality of memory cells is coupled to a corresponding word line 318, and each memory string 308 is coupled to corresponding bit lines 316 via a corresponding select transistor (such as top select transistor (TSG) 312).

Figure 4:
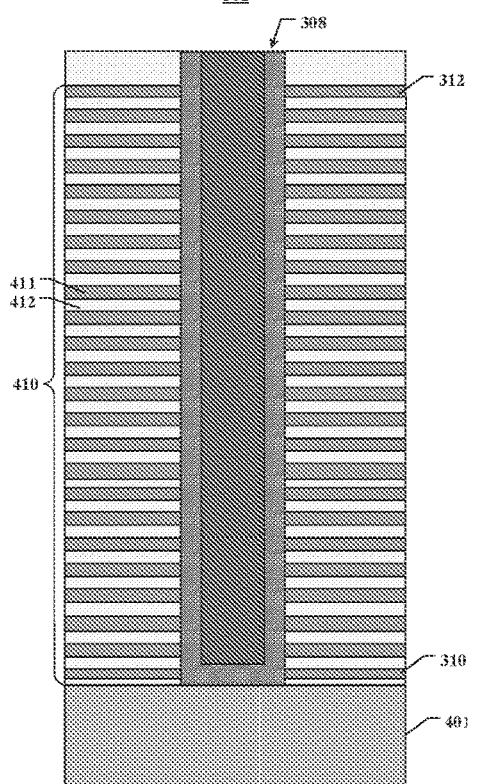
FIG. 4 is a schematic cross-sectional view of a memory cell array including NAND memory strings according to an implementation of the present disclosure.

FIG. 4 shows a schematic cross-sectional view of an example memory cell array 301 including memory strings 308, exemplified by NAND, in accordance with aspects of the present disclosure. As shown in FIG. 4, the NAND memory cell array 301 may include a stacked structure 410, which includes a plurality of gate layers 411 and a plurality of insulating layers 412 alternately stacked in sequence, and a channel structure vertically penetrating through the gate layers 411 and the insulating layers 412. The channel structure is coupled with each gate layer to form a memory cell, and the channel structure is coupled with multiple gate layers in the stacked structure 410 to form a memory string 308. The gate layer 411 and the insulating layer 412 can be stacked alternately, and two adjacent gate layers 411 are separated by an insulating layer 412.

A constituent material of the gate layer 411 may include electrically conductive material, which includes, but are not limited to, tungsten (W), cobalt (Co), copper (Cu), aluminum (Al), polysilicon, doped silicon, silicide, or any combination thereof. In some implementations, each gate layer 411 includes a metal layer, e.g., a tungsten layer. In some implementations, each gate layer 411 includes a doped-polysilicon layer. Each gate layer 411 may include a control gate surrounding the memory cell. The gate layer 411 at the top of the stacked structure 410 may extend laterally as a top select gate line, the gate layer 411 at the bottom of the stacked structure 410 may extend laterally as a bottom select gate line, and the gate layer 411 extending laterally between the top select gate line and the bottom select gate line may serve as a word line layer.

In some implementations, the stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other suitable materials.

In some implementations, memory string 308 includes a channel structure extending vertically through stacked structure 410. In some implementations, the channel structure includes a channel hole filled with semiconductor material(s) (e.g., as a semiconductor channel) and dielectric material(s) (e.g., as a memory film). In some implementations, the semiconductor channel includes silicon, e.g., polysilicon. In some implementations, the memory film is a composite dielectric layer including a tunneling layer, a storage layer (also referred to as a "charge trap/storage layer"), and a barrier layer. The channel structure may have a cylindrical shape (e.g., a pillar shape). According to some implementations, the semiconductor channel, the tunneling layer, the storage layer and the barrier layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The barrier layer may include silicon oxide, silicon oxynitride, a high dielectric constant (high-k) dielectric, or any combination thereof. In one example, the memory film may include a composite layer of silicon oxide/silicon oxynitride/silicon oxide (ONO).

Figure 5:
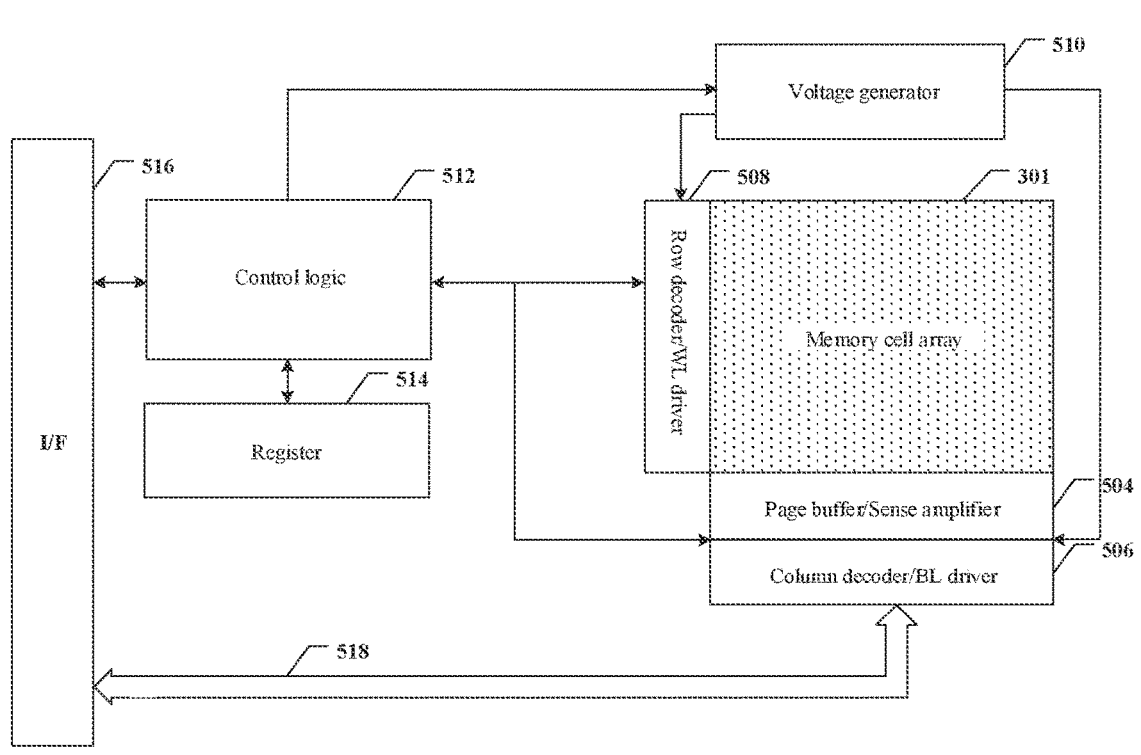
FIG. 5 is a schematic diagram of an example memory device including a memory cell array and peripheral circuits according to an implementation of the present disclosure.

Referring back to FIG. 3b, peripheral circuit 302 may be coupled to memory cell array 301 through bit lines 316, word lines 318, source lines 314, BSG lines 315, and TSG lines 313. Peripheral circuit 302 may include any suitable analog, digital, and mixed-signal circuitry for applying voltage and/or current signals to each target memory cell 306 and sensing voltage signals and/or current signals from each target memory cell 306 via bit lines 316, word lines 318, source lines 314, BSG lines 315, and TSG lines 313, so as to facilitate operation of the memory cell array 301. The peripheral circuit 302 may include various types of peripheral circuits formed using metal-oxide-semiconductor (MOS) technology. For example, some example peripheral circuits are shown in FIG. 5. Peripheral circuit 302 includes page buffer/sense amplifier 504, column decoder/bit line driver 506, row decoder/word line driver 508, voltage generator 510, control logic 512, registers 514, interface 516 and data bus 518. It should be understood that in some examples, one or more additional peripheral circuit(s) not shown in FIG. 5 may further be included.

Page buffer/sense amplifier 504 may be configured to read data from and program (write) data to memory cell array 301 according to control signals from control logic 512. In one example, page buffer/sense amplifier 504 may store program data (write data) to be programmed into memory cell array 301. In another example, page buffer/sense amplifier 504 may perform a program verify operation to ensure that data has been correctly programmed into memory cell 306 coupled to selected word line 318. In yet another example, page buffer/sense amplifier 504 may further sense a low power signal from bit line 316 representing a data bit stored in memory cell 306 and amplify the small voltage swing to a recognizable logic level during a read operation. Column decoder/bit line driver 506 may be configured to be controlled by control logic 512 and to select one or more memory strings 308 by applying bit line voltages generated from voltage generator 510.

Row decoder/word line driver 508 may be configured to be controlled by control logic 512 and select/deselect blocks 304 of memory cell array 301 and select/deselect word lines 318 of blocks 304. Row decoder/word line driver 508 may further be configured to drive word line 318 using a word line voltage generated from voltage generator 510. In some implementations, the row decoder/word line driver 508 can further select/deselect and drive the BSG line 315 and the TSG line 313. As described in detail below, the row decoder/word line driver 508 is configured to perform program operations on the memory cells 306 coupled to the selected word line(s) 318. The voltage generator 510 may be configured to be controlled by the control logic 512 and generate word line voltages (e.g., read voltages, program voltages, pass voltages, channel boost voltages, verify voltages, etc.), bit line voltages and source line voltage to be supplied to the memory cell array 301.

Control logic 512 may be coupled to each other part of the peripheral circuits described above and configured to control the operation of each other part of the peripheral circuits.

Registers 514 may be coupled to the control logic 512 and include status registers, command registers and address registers for storing status information, command operation codes (OP codes) and command addresses for controlling the operation of each peripheral circuit. Interface 516 may be coupled to control logic 512 and act as a control buffer to buffer and relay control commands received from a host (not shown) to control logic 512 and to buffer status information received from control logic 512 and relay it to the host. Interface 516 may further be coupled to column decoder/bit line driver 506 via data bus 518 and act as a data I/O interface and data buffer to buffer and relay data to or from memory cell array 301.

Returning to FIGS. 3a and 3b, in NAND memory, two ways may be used to erase the memory cell array. One way is to P well erasing, that is, the P well substrate (such as the P-type doped well region (P-Well)) is biased to a high voltage and a lower bias voltage is applied to the control gate of the memory cell for the erase operation. The other way is Gate-Induced Drain Leakage (GIDL) erasing, which applies a high voltage to the source line or bit line, and gradually floats the BSG line 315 or TSG line 313 by a lower voltage to generate GIDL current to perform an erase operation with a lower bias voltage applied to the control gate of the memory cell. Both P-well erasing and GIDL erasing can be used to lower the threshold voltage (Vt) of the memory cell. It is understood that the memory cell array may include a plurality of blocks, and the basic unit of the above-mentioned erase operation is a block.

However, as the number of times of erasing and programming increases, the tunneling efficiency of the tunneling layer in the memory cell will gradually weaken (that is, the tunneling layer will wear out), so that the number of pulses required for the erase operation will increase by one or even several, which is equivalent to the situation where the number of erasing times required for a complete erase operation will increase one or even several times, resulting in an increasingly slower erasing speed of a single block. Also, due to the different extent of wear and tear of the tunneling layer in different blocks, the erasing speeds of the blocks are also inconsistent, and the erasing time fluctuates greatly, which affects the erasing performance of the NAND memory.

Figure 6:
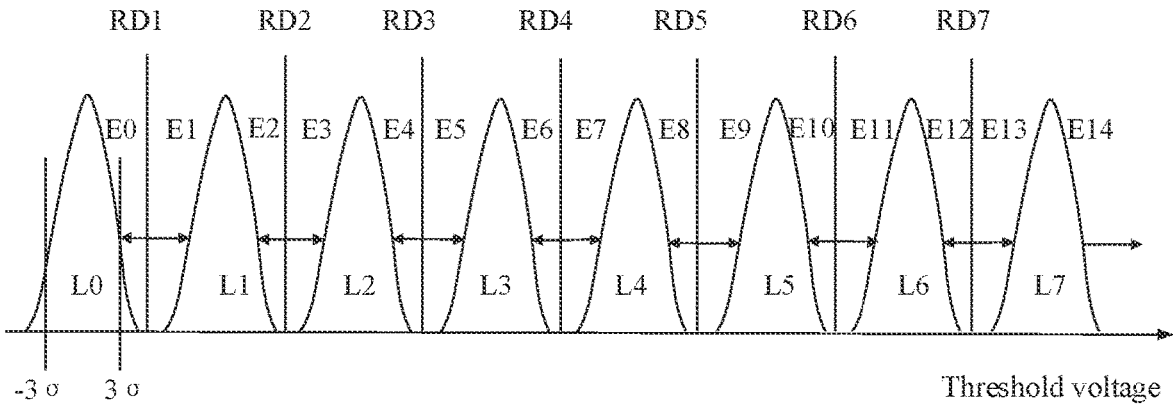
FIG. 6 is an example schematic diagram of a threshold voltage distribution including a three-bit memory cell provided by an implementation of the present disclosure.

In addition, in the process of performing the above-mentioned erase operation, the increase in the number of times of erasing will also lead to a shallow erasing, which makes the threshold voltage distributions of multiple memory cells in the block different, and thus causes the great difference in the read window margins/budgets in the eased state between multiple sub-blocks within the block and between blocks. This affects the read performance of blocks and memory devices. Here, multiple memory cells connected on the same word line in a block form a sub-block. In some examples, referring to FIG. 6, the memory device includes a plurality of blocks, each block includes a plurality of sub-blocks, and only one of the plurality of sub-blocks is shown in FIG. 6. The multiple memory cells in the example sub-block are all three-bit memory cells, and each three-bit memory cell has eight states (L0-L7), which can be categorized into erased state L0 and seven storage states (L1-L7). Among them, eight states correspond to seven read windows (such as RD1, RD2, RD3, RD4, RD5, RD6, and RD7). Due to the shallow erase effect, the difference in read window margins E0 in multiple erased states L0 corresponding to multiple blocks in the memory device is about 400 mV, which affects the read performance of the block and thus of the memory device.

To improve the problem of large difference in the read window margins E0 in the erased state L0 of multiple blocks caused by erasing, an Incremental Step Pulse Erase (ISPE) method can be used for erasing. An erasing process may include a plurality of erasing cycles, and each of the plurality of erasing cycles may include an erase operation and an erasure verification operation. The erasure voltage of the erase operation is gradually increased by a step amount. An erasure verification operation is performed after each erase operation.

However, referring to FIG. 6, after the block is erased by the above incremental step pulse erase method, there is still a large difference in the read window margins E0 in the erased state L0 among multiple blocks. Therefore, in the subsequent testing process, it is determined that the threshold voltage distribution range of the erased state of the block between $+3\sigma$ and $-3\sigma$ is too wide according to the $3\sigma$ (Sigma) criterion of normal distribution. This may affect the performance of the memory device.

It is noted that the $3\sigma$ criterion is also called the "Raida criterion." It first assumes that a set of test data contains only random errors, calculates and processes it to obtain the standard deviation, and determines an interval according to a certain probability. The error beyond this interval is assumed to not be a random error but a gross error, and the data containing this error should be eliminated. The $3\sigma$ criterion is established based on the repeated measurement of equal precision of the normal distribution, and the interference or noise leading to the singular data is difficult to satisfy the normal distribution. If the absolute value vi of the residual error of a certain measurement value in a set of measurement data is greater than $3\sigma$, the measurement value is a bad value and should be eliminated. Generally, the error equal to $\pm3\sigma$ is taken as the limit error. For the random errors of normal distribution, the probability of falling outside $\pm3\sigma$ is only 0.27%. It is very unlikely to occur in limited measurements, so the $3\sigma$ criterion holds. The $3\sigma$ criterion is the most commonly used and the simplest gross error determination criterion. It is generally applied to the situation where the number of measurements is sufficiently large ($n\geq30$) or when $n>10$ for rough determination.

Therefore, based on one or more of the above problems, an implementation of the present disclosure proposes a memory device, an operation method thereof, and a memory system. The memory device includes a memory cell array. The memory cell array may include a plurality of blocks. A peripheral circuit may be coupled to the memory cell array. The peripheral circuit may be configured to apply multiple different erasure verification voltages to the selected block among the multiple blocks after applying the first effective erasure voltage to the selected block. The peripheral circuit may be configured to, based on the results of multiple erasure verifications corresponding to the multiple different erasure verification voltages, determine the second effective erasure voltage applied to the selected block. The second effective erasure voltage may be greater than the first effective erasure voltage.

The memory cell array and the peripheral circuit are coupled to each other, where the memory cell array can include multiple memory planes, each memory plane can include multiple blocks, and each block can include multiple pages. A page is the smallest unit of read and write (that is, program) operations, and a block is the smallest unit of erase operations.

The peripheral circuit may include any suitable digital, analog, and/or mixed-signal circuit configured to facilitate various operations of the memory devices such as reading, writing, erasing, etc. For example, the peripheral circuit may include control logic (such as a control circuit or controller), a data buffer, a decoder (a decoder may also be called a coder), a driver, and a read and write circuit, etc. When the control logic receives the command and address data for read and write operations, the decoder can apply the corresponding voltage from the driver to the corresponding bit line and word line based on the decoded address under the action of the control logic to realize the data reading and writing, and exchange data with the outside through the data buffer.

Referring to FIG. 3b, a memory string 308 includes a plurality of memory cells 306, a drain side select transistor 312 at one end of the memory string that connects the memory string 308 to a bit line 316, and a source side select transistor 310 at one end of the memory string that connects the memory string 308 to a source line 314. Drain side select transistor 312 has a corresponding drain select gate (TSG) and source side select transistor 310 has a corresponding source select gate (BSG).

It is understood that due to the voltage difference between the drain select gate TSG and the bit line 316, the gate of the drain side select transistor is negatively biased, thereby forming a PN junction at the drain of the drain side select transistor 312, creating a hole current that flows down from the drain side to the source side. As the voltage difference between the drain select gate TSG and the bit line 316 applies a high electric field to the PN junction, causing hole current to travel down from the drain side to the source side and establishing a high potential within the semiconductor channel. In addition, the negative bias of the word line with respect to the channel portion can inject holes into the storage layer, thereby generating a gate-to-drain leakage current between the bit line and the drain select gate due to the band-to-band tunneling mechanism to perform data erase operation.

Similarly, referring to FIG. 4, the gate of the source side select transistor is negatively biased due to the voltage difference between the source select gate BSG in the source side select transistor 310 and the N-type doped well region, thereby forming a PN junction at the drain of the source side select transistor. In addition, the voltage difference between the source select gate BSG and the N-type doped well region applies a high electric field to the PN junction. Such a high electric field generates a gate-to-drain leakage current between the N-type doped well region and the source select gate BSG due to band-to-band tunneling to perform data erase operation.

In the implementations of the present disclosure, in the process of erasing by means of incremental step pulse erasing (ISPE), the peripheral circuit is configured to apply the first effective erasure voltage to a selected block among the plurality of blocks; here, the first effective erasure voltage may be the voltage difference between the source line SL and the source select gate BSG of the selected block in the first erasing cycle of an erasing process, or the voltage difference between the source line SL and all the word lines WL of the selected block. After the first effective erasure voltage is applied, multiple different erasure verification voltages are applied to the selected block, and corresponding multiple erasure verification results are obtained according to the multiple different erasure verification voltages. It can be determined that the second effective erasure voltage applied to the selected block is different according to different erasure verification results. The second effective erasure voltage here is the voltage difference between the source line SL, and the source select gate BSG in the second erasing cycle of an erasing process, or the voltage difference between the source line SL and all word lines WL of the selected block, where the second effective erasure voltage is greater than the first effective erasure voltage.

In some implementations, the multiple different erasure verification voltages may include three different erasure verification voltages, and correspondingly, the multiple erasure verification results may include three erasure verification results. In some further implementation, the multiple different erasure verification voltages may further include two, four, five, etc. different erasure verification voltages. Here, only three different erasure verification voltages are taken as an example.

It is noted that when multiple different erasure verification voltages are applied to the selected block as above, there is a certain correlation among the multiple different erasure verification voltages. In particular, when the first erasure verification voltage is applied, it is determined whether the second erasure verification voltage needs to be applied to the selected block according to the first erasure verification result. Exemplarily, when the first erasure verification result is successful, it indicates that a corresponding extent of erase operation has been completed for the all memory cells in the selected block under the first erasure verification voltage. That is, it may not necessary to apply a second erasure verification voltage to the selected block. When the first erasure verification result fails, it indicates that there are memory cells not erased to a corresponding extent in the selected block under the first erasure verification voltage. Then, it is beneficial to apply the second erasure verification voltage to the selected block. Similarly, after the second erasure verification voltage is applied, a determination may be made as to whether a third erasure verification voltage needs to be applied to the selected block based on the second erasure verification result. When the second erasure verification result is successful, it indicates that the corresponding extent of erase operation has been completed for all the memory cells in the selected block under the second erasure verification voltage. That is, it is may not be necessary to apply the third erasure verification voltage to the selected block. When the second erasure verification result fails, it indicates that there are memory cells that have not been erased to a corresponding extent in the selected block under the second erasure verification voltage. Here, the third erasure verification voltage may be applied to the selected block.

In some implementations, the three different erasure verification voltages may include, e.g., a first erasure verification voltage, a second erasure verification voltage, and a third erasure verification voltage whose voltage values increase sequentially. The first erasure verification voltage, the second erasure verification voltage and the third erasure verification voltage respectively correspond to the first erasure verification result, the second erasure verification result, and the third erasure verification result.

Referring to FIG. 7, three different erasure verification voltages may respectively include, e.g., the first erasure verification voltage Vev, the second erasure verification voltage Vev_coarse1, and the third erasure verification voltage Vev_coarse2. The third erasure verification voltage Vev_coarse2 is greater than the second erasure verification voltage Vev_coarse1, and the second erasure verification voltage Vev_coarse1 is greater than the first erasure verification voltage Vev. In some implementations, the voltage difference between the first erasure verification voltage Vev and the second erasure verification voltage Vev_coarse1 is below 0.5V, and the voltage difference between the second erasure verification voltage Vev_coarse1 and the third erasure verification voltage Vev_coarse2 is below 0.5V.

It is noted that, in some implementations, a state dual strobe sense verification method can also be used and three verification results corresponding to three erasure verification voltages are simultaneously obtained. That is, after the first erasure verification voltage Vev is applied, the verification results obtained after applying the second erasure verification voltage Vev_coarse1 and the third erasure verification voltage Vev_coarse2 can be obtained simultaneously.

Correspondingly, based on the difference of the three erasure verification voltages, the results of the three erasure verifications are also different. Referring to FIG. 7, the first erasure verification voltage Vev corresponds to the first erasure verification result D1, and the second erasure verification voltage Vev_coarse1 corresponds to the second erasure verification result D2, and the third erasure verification voltage Vev_coarse2 corresponds to the third erasure verification result D3. The first erasure verification result D1, the second erasure verification result D2, and the third erasure verification result D3 can all be utilized to characterize whether the selected block is successfully erased or the extent to which the selected block is erased under the corresponding erasure verification voltage.

Based on the above multiple erasure verification voltages, the corresponding verification results may be categorized into the following situations: the first erasure verification result is successful, the first erasure verification result fails, and the second erasure verification result is successful, the second erasure verification result fails and the third erasure verification result is successful, and the third erasure verification result fails. According to the above different erasure verification results, the voltage value of the second effective erasure voltage is different.

Here, the peripheral circuit may be further configured to, when the first erasure verification result fails and the second erasure verification result is successful, determine that the voltage value of the second effective erasure voltage is increased by a first voltage increment greater than the voltage value of the first effective erasure voltage; the peripheral circuit may be further configured to, when the second erasure verification result fails and the third erasure verification result is successful, determine that the voltage value of the second effective erasure voltage is increased by a second voltage increment greater than the voltage value of the first effective erasure voltage the peripheral circuit may be further configured to, when the third erasure verification result fails, determine that the voltage value of the second effective erasure voltage is increased by a third voltage increment greater than the voltage value of the first effective erasure voltage. The third voltage increment is greater than the second voltage increment, and the second voltage increment is greater than the first voltage increment.

With reference to FIG. 7, when the first erasure verification result D1 fails, the second erasure verification voltage Vev_coarse1 is applied to the selected block, and the second erasure verification result D2 is obtained. When the second erasure verification result D2 is successful (e.g., when the first erasure verification result D1 fails and the second erasure verification result D2 is successful), the voltage value of the second effective erasure voltage applied to the selected block is increased by the first voltage increment based on the voltage value of the first effective erasure voltage. For example, if the voltage value of the first effective erasure voltage is Vera-init and the first voltage increment is $V_{ISPE}$, the second effective erasure voltage is Vera_init+$V_{ISPE}$. In some further implementations, the first voltage increment $V_{ISPE}$ may be a step voltage when performing an incremental step pulse erase (ISPE) operation.

When the second erasure verification result D2 fails, the third erasure verification voltage Vev_coarse2 is applied to the selected block, and the third erasure verification result D3 is obtained. When the third erasure verification result D3 is successful (e.g., when the second erasure verification result D2 fails and the third erasure verification result D3 is successful), the voltage value of the second effective erasure voltage applied to the selected block is increased by the second voltage increment based on the voltage value of the first effective erasure voltage. Here, the second voltage increment is greater than the first voltage increment. Exemplarily, if the voltage value of the first effective erasure voltage is Vera-init, and the second voltage increment is $V_{ISPE}+\Delta V1$, the second effective erasure voltage is Vera_init+$V_{ISPE}+\Delta V1$.

When the third erasure verification result D3 fails, the voltage value of the second effective erasure voltage applied to the selected block is increased by the third voltage increment based on the voltage value of the first effective erasure voltage. Here, the third voltage increment is greater than the second voltage increment. For example, if the voltage value of the first effective erasure voltage is Vera-init, and the third voltage increment is $V_{ISPE}+\Delta V2$, where $\Delta V2$ is greater than $\Delta V1$, then the second effective erasure voltage is: Vera_init+$V_{ISPE}+\Delta V2$. In this way, different erasing extents of multiple blocks can be determined according to different erasure verification results, and different second effective erasure voltages can be applied corresponding to different erasing extents of the blocks, so that the erasing extents of multiple blocks after different second effective erasure voltages are applied tend to be consistent, and the erasing speeds tend to be consistent. Further, the threshold voltage distributions of the erased states among different blocks tends to be uniform and consistent, thereby improving the reading and erasing performance of the memory device.

It is noted that when the first erasure verification result D1 is successful, it indicates that the erase operation has been completed, and there is no need to perform subsequent erasure verification operations at this time.

Figure 9:
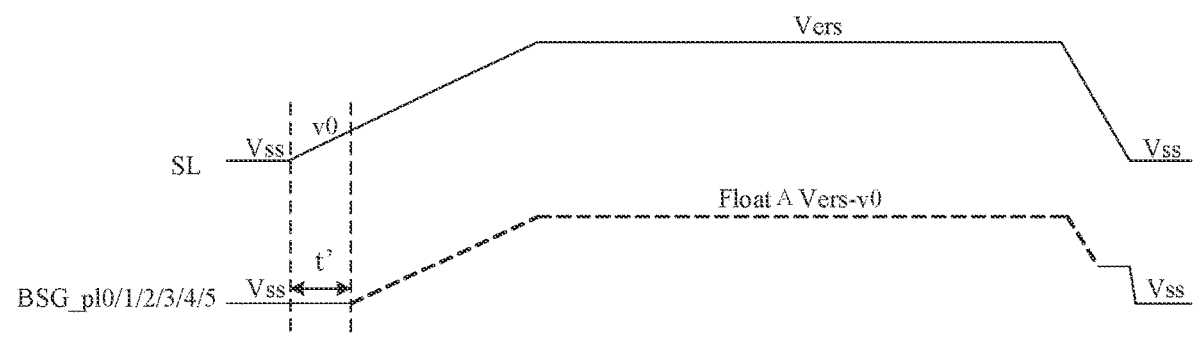
FIG. 9 is an example schematic diagram including adjusting voltage differences between source lines and all bit lines for multiple blocks provided by an implementation of the present disclosure.

To further understand this solution, the specific operation of how to apply different second effective erasure voltages to the block will be described in detail below with reference to FIGS. 8a, 8b and 9. It is understood that the application of different second effective erasure voltages may be done to the same block at different times, or may be applied respectively to different blocks in the same memory plane, or may be applied respectively to multiple blocks in different memory planes. However, whether different second effective erasure voltages are applied to the same block at different times, or different second effective erasure voltages are applied respectively to multiple blocks, the voltage value of the second effective erasure voltage can be adjusted/changed by changing the preset duration.

For instance, in some implementations, a pulse corresponding to a first erasure voltage is applied to the source line of the selected block. During a voltage of the source line rising to the first erasure voltage, a first voltage is applied to the source select gate of the selected block and the source select gate is floated after a preset duration. During the voltage of the source line being stabilized at the first erasure voltage, a voltage of the source select gate is stabilized at a second voltage. Here, the second voltage is lower than the first erasure voltage, and the difference between the first erasure voltage and the second voltage constitutes the second effective erasure voltage. The longer the preset duration is, the larger the voltage value of the second effective erasure voltage.

Here, the initial voltages on the source line SL of the selected block and the corresponding source select gate BSG are both the first voltage (such as the ground voltage Vss). At the first moment, the source line SL of the selected block is applied with the first erasure voltage Vers, and the voltage of the source line SL reaches the first erasure voltage Vers after a period of time, and is stabilized at the first erasure voltage Vers.

During the process in which the voltage of the source line SL of the selected block rises from the ground voltage Vss to the first erasure voltage Vers, the source select gate BSG of the selected block is changed from being applied with the first voltage (such as the ground voltage Vss) to floating after a preset duration. The preset duration here can be set according to actual needs. As the voltage of the source line SL of the selected block reaches the first erasure voltage Vers, the voltage of the source select gate BSG in the corresponding block will be stabilized at the second voltage (Vers-V) due to the coupling effect. The second voltage is also called a hold and release voltage. It is noted that multiple source select gates BSG may be set in the selected block, such as the first source select gate BSG0_0, the second source select gate BSG0_1, etc. When there are multiple source select gates BSG in the block, corresponding voltages are applied to the multiple source select gates BSG after the preset duration.

It is understood that the voltage difference between the source line SL of the selected block and the corresponding source select gate BSG is the second effective erasure voltage. When the first erasure voltage on the source line SL of the selected block remains unchanged, the longer the preset duration is, the longer the time for the voltage of the source select gate BSG in the block is forced to be kept at the first voltage. Consequently, the shorter the coupling effect time on the source line SL is, the smaller the last stabilized second voltage on the corresponding source select gate BSG, and the larger the voltage value of the second effective erasure voltage. Therefore, the voltage value of the second effective erasure voltage can be adjusted/changed by changing the preset duration based on different erasure verification results, so that the erasing extents of multiple blocks tend to be consistent.

In some implementations, when the first erasure verification result fails and the second erasure verification result is successful, the peripheral circuit may be configured to determine that the preset duration is a first duration. In some implementations, when the second erasure verification result fails and the third erasure verification result is successful, the peripheral circuit may be configured to determine that the preset duration is a second duration When the third erasure verification result fails, the peripheral circuit may be configured to determine that the preset duration is a third duration. The first duration is shorter than the second duration, and the second duration is shorter than the third duration.

In the implementation of the present disclosure, when the first erasure verification result fails and the second erasure verification result is successful, it indicates that the current erasure extent of the selected block is relatively deep. In other words, there is a small amount of memory cells that has not been erased in the selected block (the first corresponding extent). At this time, the voltage value of the second effective erasure voltage is increased by the first voltage increment $V_{ISPE}$ than the voltage value of the first effective erasure voltage, by controlling the preset duration (for example, setting the preset duration as the first duration).

When the second erasure verification result fails and the third erasure verification result is successful, it indicates that the current erasing extent of the selected block is shallower than that of the first corresponding extent. That is, there is a certain amount of memory cells in the selected block that have not been erased (the second corresponding extent). At this time, the voltage value of the second effective erasure voltage is increased by the second voltage increment $V_{ISPE}+\Delta V1$ than the voltage value of the first effective erasure voltage, by controlling the preset duration (such as setting the preset duration as the second duration).

When the third erasure verification result fails, it indicates that the current erasing extent of the selected block is relatively shallow compared to the second relative extent, that is, there is a large amount of memory cells in the selected block that have not been erased (the third corresponding extent). At this time, the voltage value of the second effective erasure voltage can be increased by a third voltage increment $VISPE+\Delta V2$ than the voltage value of the first effective erasure voltage, by controlling the preset duration (for example, setting the preset duration as the third duration).

In other words, the extent of erasure of the block characterized by the first corresponding extent, the second corresponding extent, and the third corresponding extent gradually becomes shallower in sequence, and the correspondingly controlled preset duration, such as the first duration, the second duration, and the third duration, may gradually increase in sequence.

In some other implementations, referring to FIG. 8a, the selected block includes multiple blocks, and the selected multiple blocks are respectively stored in different memory planes. Here, the applying different second effective erasure voltages to the selected multiple blocks means applying different second effective erasure voltages to selected multiple memory planes. The peripheral circuit may be configured to simultaneously apply a pulse corresponding to the first erasure voltage to the source lines of each of the selected multiple blocks.

It is noted that, after applying multiple different erasure verification voltages to multiple blocks in multiple memory planes, the erasure extents may be the same or different. When the erasure extents of the selected block in multiple memory planes are the same, the set preset durations are the same, e.g., t', and the applied second effective erasure voltages are the same (all are v0), with reference to FIG. 9. When the erasing extent of the selected blocks in multiple memory planes is different, the set preset durations are different (such as t1, t2, t3 or t4, t5, t6), and the applied second effective erasure voltages are also different, with reference to FIGS. 8a and 8b. In order to understand the present disclosure more clearly, different erasing extents of multiple blocks are taken as an example for illustration in the following implementations.

Referring to FIG. 8a, the initial voltages on the source line SL of each of the selected multiple blocks and on the corresponding source select gate BSG all are the first voltage (such as the ground voltage Vss). At the first moment (such as t0), the first erasure voltage Vers is simultaneously applied to the source lines SL of each of the selected multiple blocks, and after a period of time, the voltage of the multiple source lines SL reaches the first erasure voltage Vers and is stabilized at the first erasure voltage Vers.

During the process in which the voltage of the source line SL of each of the selected multiple blocks rises from the ground voltage Vss to the first erasure voltage Vers, the source select gate BSG of each of the selected multiple blocks is changed from being applied with the first voltage to floating after the preset duration. The preset duration here can be set according to actual needs. As the voltage of the source line SL of each of the selected multiple blocks reaches the first erasure voltage Vers, the voltage of the source select gate BSG in the corresponding block will be stabilized at the second voltage (Vers-v*) due to the coupling effect, where v* corresponds to different blocks.

Continuing to refer to FIG. 8a, the selected multiple blocks are respectively stored in the first memory plane (p10), the second memory plane (p11), and the third memory plane (p12), and the erasing extent of the selected multiple blocks gradually becomes shallower in sequence. When the first voltage on the source select gate BSG is floated at different time after being maintained for different durations, the second voltages on the source select gates (bsg-p10, bsg-p11, bsg-p12) respectively corresponding to multiple blocks are Vers-v0, Vers-v1, and Vers-v2 respectively. Here, the second voltage on the source select gates BSG of the blocks corresponding to the first memory plane to the third memory plane is gradually decreased in sequence, e.g., Vers-v0>Vers-v1>Vers-v2 (this situation is shown in FIG. 8a). In some further implementations, when the erasing extents of the selected multiple blocks gradually become deeper, the second voltage on the source select gate BSG corresponding to different memory planes can also be gradually increased by adjusting the time when the source select gate BSG floats, e.g., Vers-v0<Vers-v1<Vers-v2. Other setting methods can also be selected according to actual needs, which will not be repeated herein. When the voltage on the source line SL of each of the selected multiple blocks is stabilized at the first erasure voltage, the second effective erasure voltages applied to the selected multiple blocks are respectively v0, v1, and v2, where the size relationship of v0, v1 and v2 is related to the second voltage (H&R) on the corresponding source select gate BSG. Here, the smaller (shallower) the erasing extent of the block is, the larger the second voltage (Vers-v*), and the smaller the corresponding second effective erasure voltage (v*).

Based on this, when performing an erase operation on selected multiple blocks in multiple memory planes, the second voltage of the source select gate (hold and release voltage) can be changed by changing the preset duration, so as to apply different second effective erasure voltages to the selected blocks in the different memory planes.

Referring to FIG. 8a, when the first erasure verification result fails and the second erasure verification result is successful, it indicates that the erasing extent of the currently selected block is relatively deep, and the preset duration can be set as t1 to obtain the second voltage Vers-v0 so as to determine the second effective erasure voltage v0. When the second erasure verification result fails and the third erasure verification result is successful, it indicates that the erasing extent of the currently selected block is shallow, and the preset duration can be set as t2 to obtain the second voltage Vers-v1 so as to determine the second effective erasure voltage v1.

When the third erasure verification result fails, it indicates that the erasing extent of the currently selected block is very shallow, and the preset duration can be set as t3 to obtain the second voltage Vers-v2 so as to determine the second effective erasure voltage v2, where t1<t2<t3.

That is, in the implementation of the present disclosure, each memory plane can be individually controlled, and different second voltages (H&R voltages) can be individually applied to the blocks in each memory plane, so as to enable the different second effective erasure voltages to be applied to different blocks in different memory planes. In this way, the second effective erasure voltage can be flexibly adjusted/changed according to the difference in erasing extent, and the difference in the threshold voltage distributions in the erased state L0 between blocks can be reduced, improving the reading and erasing performances of the memory device.

In some other implementations, referring to FIG. 8b, the selected multiple blocks are different blocks (such as block-a, block-b, block-c) in the same memory plane, and when the first voltage on the source select gate BSG is floated at different time after being kept for different durations, the second voltages on the source select gates BSG respectively corresponding to the multiple blocks are respectively Vers-va, Vers-vb, and Vers-vc. When the erasing extents of block-a, block-b, and block-c gradually become shallower in sequence, the different preset durations corresponding to different time gradually increase, such as t4<t5<t6, and their corresponding second voltages gradually decrease in sequence, such as Vers-va>Vers-vb>Vers-vc; and the corresponding second effective erasure voltage increases gradually in sequence, such as va>vb>vc. In this way, the second effective erasure voltage applied to the block can be adjusted/changed by controlling the preset duration.

In addition, it is noted that after an erasing cycle is completed for the selected block, the voltages of all source lines SL and source select gates BSG are recovered to the first voltage (ground voltage, Vss).

In an implementation of the present disclosure, an example of applying different second effective erasure voltages to different blocks when using another erasing mode is further provided. Namely, by changing the voltage difference between the source line SL and all word lines WL of the selected block, the second effective erasure voltage of the corresponding block is changed.

In some implementations, the block includes a drain terminal and a source terminal, the source terminal is provided with a source line, and the block includes a plurality of word lines located between the drain terminal and the source terminal.

The peripheral circuit may be further configured to apply a second erasure voltage to the source line of the selected block, and apply a first voltage to all word lines of the selected block, a difference between the second erasure voltage and the first voltage constitutes the second effective erasure voltage. When the first voltage is fixed, the greater a voltage value of the second erasure voltage is, the greater the voltage value of the second effective erasure voltage.

Exemplarily, the voltage applied to the source line SL of each of the selected multiple blocks is the second erasure voltage, the voltage applied to all the word lines WL of the selected block is the first voltage, and the difference between the second erasure voltage and the first voltage constitutes a second effective erasure voltage. When the first voltage does not change, the second erasure voltage is proportional to the voltage value of the second effective erasure voltage. For example, the greater the voltage value of the second erasure voltage is, the greater the voltage value of the second effective erasure voltage. In this way, the situation of applying different second effective erasure voltages to different blocks can be realized by changing the second erasure voltage.

In some implementations, the peripheral circuit may be further configured to perform an erase operation on the selected block by applying a gradually increasing effective erasure voltage multiple times. The peripheral circuit may be further configured to apply the third erasure verification voltage to the selected block directly after applying an effective erasure voltage each time within preset times. The peripheral circuit may be further configured to, based on the erasure verification result corresponding to the third erasure verification voltage, determine the effective erasure voltage to be applied to the selected block next time. The peripheral circuit may be further configured to apply the plurality of different erasure verification voltages to the selected block after applying the effective erasure voltage each time beyond the preset times. The peripheral circuit may be further configured to, based on a plurality of the erasure verification results corresponding to the plurality of different erasure verification voltages, determine the effective erasure voltage to be applied to the selected block next time.

Here, in the process of performing erasure by means of incremental step pulse erasing (ISPE), an erasing process may include multiple erasing cycles. In first few erasing cycles (e.g., preset times of erasing cycles), there may not exist the situation where the first erasure verification result is successful after the first erasure verification voltage is applied. Therefore, the third erasure verification voltage is directly applied to the selected block in the first few erasing cycles, and the third erasure verification result is determined. The preset times may be estimated according to historical experience. Here, the preset times are times for the third erasure verification result from failure to success.

In situations in which the third erasure verification result is successful in the first few erasing cycles, after the first effective erasure voltage is applied to the selected block each time in each subsequent erasing cycle (e.g., beyond the preset times), multiple different erasure verification voltages are applied, and the second effective erasure voltage to be applied to the selected block next time is determined according to the multiple erasure verification results corresponding to the multiple different erasure verification voltages. In this way, the erasure verification operation time can be saved, and the erasure verification operation efficiency can be improved.

As mentioned above, an erasing process in the implementation of the present disclosure may include multiple erasing cycles, and each of the multiple erasing cycles includes an erase operation and three erasure verification operations. For instance, when the first erasure verification result D1 fails, the second erasure verification voltage Vev_coarse1 is applied to the selected block, and the second erasure verification result D2 is obtained. When the second erasure verification result D2 fails, a third erasure verification voltage Vev_coarse2 is applied to the selected block, and the third erasure verification result D3 is obtained. In another implementation of the present disclosure, in the first few erase cycles of multiple erase cycles, the third erasure verification may be directly performed on the memory cell. That is, after the first effective erasure voltage is applied to the selected block, the third erasure verification voltage Vev_coarse2 is directly applied to the selected block, and the third erasure verification result is determined.

Among the verification results, if there is no memory cell whose threshold voltage is lower than the third erasure verification voltage Vev_coarse2, this indicates that the threshold voltage of all memory cells will not reach below the second erasure verification voltage Vev_coarse1. Here, the next erasing cycle is directly entered at this time. If there is a memory cell whose threshold voltage is lower than the third erasure verification voltage Vev_coarse2, verification may be performed with the second erasure verification voltage Vev_coarse1, and if there is no memory cell whose threshold voltage is lower than the second erasure verification voltage Vev_coarse1, the next erasing cycle is entered. If there is a memory cell whose threshold voltage is lower than the second erasure verification voltage Vev_coarse1, verification may be performed with the first erasure verification voltage Vev, and the next erasing cycle is entered according to the verification result. After that, the verification can be started from the first erasure verification voltage Vev each time, so that the verification time in the early stage can be reduced, thereby reducing the erasing time.

Based on this, in an implementation of the present disclosure, after applying the first effective erasure voltage to each selected block of the multiple blocks, the erasing extent of each block is determined by applying multiple different erasure verification voltages to the multiple blocks respectively, and according to the different erasing extents for multiple blocks, different second effective erasure voltages are applied thereto, so that the erasing extents of the multiple blocks tend to be consistent after different second effective erasure voltages are applied, and the erasing speeds also tend to be consistent. Furthermore, the threshold voltage distributions in the erased states among different blocks tend to be uniform and consistent, thereby improving the reading and erasing performances of the memory device.

In addition, the implementation of the present disclosure further proposes a comparison example of the threshold voltage distributions in the erased state of the block after adopting two different erasing modes in different memory states. Among them, the first erasing mode is one in which each erasing cycle mentioned in the above-mentioned implementations of the present disclosure includes one erase operation and three erasure verification operations, and the second erasing mode is one in which each erasing cycle of the related art includes one erase operation and one erasure verification operation.

Figure 10:
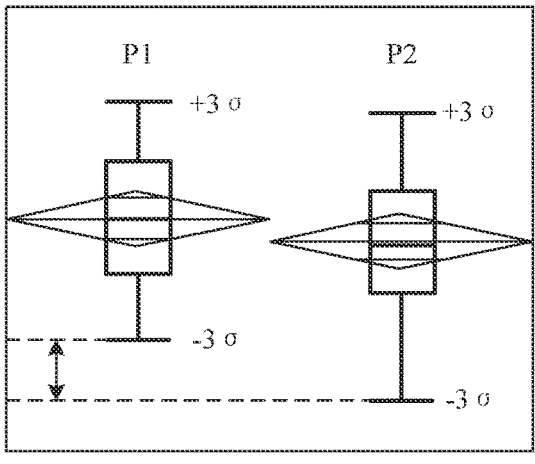
FIG. 10 is a schematic diagram of threshold voltage distributions of a block in an erased state obtained and read by using different erasing modes provided by an implementation of the present disclosure.
Figure 11:
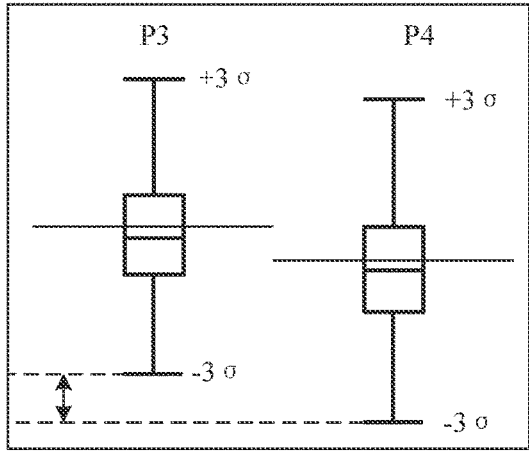
FIG. 11 is a schematic diagram of threshold voltage distributions of another block in an erased state obtained by using different erasing modes provided by another implementation of the present disclosure.

Referring to FIGS. 10 and 11, the schematic diagram of the threshold voltage distributions in the erased state of a block after respectively adopting the first erasing mode (P1) and the second erasing mode (P2) when no data is stored in some memory cells of the block is illustrated in FIG. 10, and the schematic diagram of the threshold voltage distributions in the erased state of the block after respectively adopting the first erasing mode (P3) and the second erasing mode (P4) when data are stored in all memory cells of the block is illustrated in FIG. 11.

It can be seen in conjunction with FIGS. 6 and 10 that, when there are memory cells that have not stored data in the block, the threshold voltage range of the erased state L0 of the block between $+3\sigma$ and $-3\sigma$ is narrowed. In other words, the read window margin E0 of the erased state L0 is increased, after applying the second effective erasure voltage to the selected block by using the first erasing mode. It can be seen in conjunction with FIGS. 6 and 11 that, when data are stored in all the memory cells in the block, the threshold voltage range of the erased state L0 of the block between $+3\sigma$ and $-3\sigma$ is likewise narrowed. That is, the read window margin E0 of the erased state L0 is increased, after applying the second effective erasure voltage to the selected block by using the first erasing mode. In other words, regardless of whether there are memory cells that have not stored data in the block, applying the second effective erasure voltage to the selected block by using the first erasing mode can increase the read window margins of the erased state of the block. In this way, the read performance of the block and the memory device can be improved.

On the other hand, an implementation of the present disclosure also proposes a method of operation a memory device. The method may include applying a plurality of different erasure verification voltages to a selected block of the memory device after applying a first effective erasure voltage to the selected block. The method may include determining a second effective erasure voltage applied to the selected block according to a plurality of erasure verification results corresponding to the plurality of different erasure verification voltages. The second effective erasure voltage is greater than the first effective erasure voltage.

In some implementations, the plurality of different erasure verification voltages include three different erasure verification voltages, and the plurality of erasure verification results include three erasure verification results.

In some implementations, the three different erasure verification voltages include: a first erasure verification voltage, a second erasure verification voltage, and a third erasure verification voltage whose voltage values increase sequentially. The first erasure verification voltage, the second erasure verification voltage and the third erasure verification voltage respectively correspond to the first erasure verification result, the second erasure verification result, and the third erasure verification result.

The method may include, when the first erasure verification result fails and the second erasure verification result is successful, determining that the voltage value of the second effective erasure voltage is increased by a first voltage increment greater than the voltage value of the first effective erasure voltage. The method may include, when the second erasure verification result fails and the third erasure verification result is successful, determining that the voltage value of the second effective erasure voltage is increased by a second voltage increment greater than the voltage value of the first effective erasure voltage. The method may include, when the third erasure verification result fails, determining that the voltage value of the second effective erasure voltage is increased by a third voltage increment greater than the voltage value of the first effective erasure voltage. The third voltage increment is greater than the second voltage increment, and the second voltage increment is greater than the first voltage increment.

In some implementations, the block includes a drain terminal and a source terminal. The source terminal may be provided with a source line and a source select gate. The method may include applying a pulse corresponding to a first erasure voltage to the source line of the selected block. The method may include, during a voltage of the source line rising to the first erasure voltage, applying a first voltage to the source select gate of the selected block and float the source select gate after a preset duration. The method may include, during the voltage of the source line being stabilized at the first erasure voltage, stabilizing a voltage of the source select gate at a second voltage. The second voltage is lower than the first erasure voltage, and the difference between the first erasure voltage and the second voltage constitutes the second effective erasure voltage. The longer the preset duration is, the larger the voltage value of the second effective erasure voltage.

In some implementations, the method may further include, when the first erasure verification result fails and the second erasure verification result is successful, determining that the preset duration is a first duration. In some implementations, the method may further include, when the second erasure verification result fails and the third erasure verification result is successful, determining that the preset duration is a second duration. In some implementations, the method may further include, when the third erasure verification result fails, determining that the preset duration is a third duration. The first duration is shorter than the second duration, and the second duration is shorter than the third duration.

In some implementations, the block includes a drain terminal and a source terminal, the source terminal is provided with a source line, and the block includes a plurality of word lines located between the drain terminal and the source terminal. The method may further include applying a second erasure voltage to the source line of the selected block. The method may further include applying a first voltage to all word lines of the selected block, a difference between the second erasure voltage and the first voltages constitutes the second effective erasure voltage. The greater a voltage value of the second erasure voltage is, the greater the voltage value of the second effective erasure voltage.

In some implementations, the method may further include performing an erase operation on the selected block by applying a gradually increasing effective erasure voltage multiple times. In some implementations, the method may further include applying the third erasure verification voltage to the selected block directly after applying an effective erasure voltage each time within preset times, and according to the erasure verification result corresponding to the third erasure verification voltage, determining the effective erasure voltage to be applied to the selected block next time. In some implementations, the method may further include applying the plurality of different erasure verification voltages to the selected block after applying the effective erasure voltage each time beyond the preset times, and according to a plurality of the erasure verification results corresponding to the plurality of different erasure verification voltages, determining the effective erasure voltage to be applied to the selected block next time.

In yet another aspect, an implementation of the present disclosure also discloses a memory system. The memory system includes a memory controller and the memory device described in the above-mentioned implementations of the present disclosure. The memory controller is used to control the memory device to perform read, write and erase operations. Here, the memory controller and the memory device may be coupled in any suitable manner. In the implementations of the present disclosure, the memory device may be a semiconductor memory that stores data in a non-volatile manner, for example, a NAND memory. The memory system is connected to a host, and the host may be an electronic device such as a personal computer or a mobile terminal.

In some implementations, the memory system includes a Universal Flash Storage (UFS) device or a solid state drive.

It is understood that reference throughout the specification to "one implementation" or "an implementation" means that a particular feature, structure or characteristic related to the implementation is included in at least one implementation of the present disclosure. Thus, appearances of "in one implementation" or "in an implementation" in various places throughout the specification are not necessarily referring to the same implementation. Furthermore, the particular features, structures or characteristics may be combined in any suitable manner in one or more implementations. It should be understood that in various implementations of the present disclosure, the sequence numbers of the above-mentioned processes do not mean the order of execution, and the execution order of the processes should be determined by their functions and inherent logic, and should not limit implementation process of the implementations of the present disclosure. The serial numbers of the above-mentioned implementations of the present disclosure are for description only, and do not represent the advantages and disadvantages of the implementations.

The methods disclosed in the several method implementations provided in the present disclosure can be combined arbitrarily to obtain new method implementations if there is no conflict.

The forgoing description is only a specific implementation of the present disclosure, but the scope of protection of the present disclosure is not limited thereto. Anyone skilled in the art can easily conceive of changes or substitutions within the technical scope of the present disclosure, which should fall within the protection scope of the present disclosure. Therefore, the protection scope of the present disclosure shall be determined by the protection scope of the claims.

What is claimed is:

1. A memory device, comprising:
a memory cell array comprising a plurality of blocks; and
a peripheral circuit coupled to the memory cell array and configured to:
apply a plurality of different erasure verification voltages to a selected block among the plurality of blocks after applying a first effective erasure voltage to the selected block;
determine a preset duration from among a plurality of preset durations for applying a second effective erasure voltage to the selected block according to a plurality of erasure verification results corresponding to the plurality of different erasure verification voltages; and
apply the second effective erasure voltage to the selected block based on the preset duration,
wherein the second effective erasure voltage is greater than the first effective erasure voltage.

2. The memory device of claim 1, wherein:
the plurality of different erasure verification voltages comprise three different erasure verification voltages, and
the plurality of erasure verification results comprise three erasure verification results.

3. The memory device of claim 2, wherein:
the three different erasure verification voltages comprise:
a first erasure verification voltage, a second erasure verification voltage, and a third erasure verification voltage whose voltage values increase sequentially; and
the first erasure verification voltage, the second erasure verification voltage, and the third erasure verification voltage respectively correspond to a first erasure verification result, a second erasure verification result and a third erasure verification result, and
the peripheral circuit is further configured to:
when the first erasure verification result fails and the second erasure verification result is successful, determine that a voltage value of the second effective erasure voltage is increased by a first voltage increment based on a voltage value of the first effective erasure voltage;
when the second erasure verification result fails and the third erasure verification result is successful, determine that the voltage value of the second effective erasure voltage is increased by a second voltage increment based on the voltage value of the first effective erasure voltage; and
when the third erasure verification result fails, determine that the voltage value of the second effective erasure voltage is increased by a third voltage increment based on the voltage value of the first effective erasure voltage,
wherein the third voltage increment is greater than the second voltage increment, and the second voltage increment is greater than the first voltage increment.

4. The memory device of claim 3, wherein:
the block comprises a drain terminal and a source terminal, the source terminal being provided with a source line and a source select gate, and
the peripheral circuit is further configured to:
apply a pulse corresponding to a first erasure voltage to the source line of the selected block;
during a voltage of the source line rising to the first erasure voltage, apply a first voltage to the source select gate of the selected block and float the source select gate after another preset duration; and
during the voltage of the source line being stabilized at the first erasure voltage, stabilize a voltage of the source select gate at a second voltage, the second voltage being lower than the first erasure voltage, and the difference between the first erasure voltage and the second voltage constituting the second effective erasure voltage, and
the voltage value of the second effective erasure voltage is proportional to a length of the preset duration.

5. The memory device of claim 4, wherein:
the peripheral circuit is further configured to:
when the first erasure verification result fails and the second erasure verification result is successful, determine that the preset duration is a first duration;
when the second erasure verification result fails and the third erasure verification result is successful, determine that the preset duration is a second duration;
when the third erasure verification result fails, determine that the preset duration is a third duration; and
the first duration is shorter than the second duration, and the second duration is shorter than the third duration.

6. The memory device of claim 4, wherein:
the selected block comprises a plurality of selected blocks, and
the peripheral circuit is configured to:
apply a pulse corresponding to the first erasure voltage to the source line of each block in the selected plurality of blocks simultaneously.

7. The memory device of claim 6, wherein:
the memory cell array comprises a plurality of memory planes,
each of the selected plurality of blocks are respectively stored in a different memory plane of the plurality of memory planes, and
to apply the second effective erasure voltage to the selected block, the peripheral circuit is further configured to:
apply the second effective erasure voltage to the plurality of selected blocks in the plurality of memory planes by changing the preset duration when performing an erase operation on the selected plurality of blocks in the plurality of memory planes.

8. The memory device of claim 3, wherein:
the block comprises a drain terminal and a source terminal, the source terminal is provided with a source line,
the block comprises a plurality of word lines located between the drain terminal and the source terminal, the peripheral circuit is further configured to:

apply a second erasure voltage to the source line of the selected block, and apply a first voltage to all word lines of the selected block, a difference between the second erasure voltage and the first voltages constituting the second effective erasure voltage, and a voltage value of the second effective erasure voltage is proportional to a voltage value of the second erasure voltage.

9. The memory device of claim 4, wherein the first voltage is a ground voltage.

10. The memory device of claim 3, wherein the peripheral circuit is further configured to:

perform an erase operation on the selected block by applying a gradually increasing an effective erasure voltage multiple times;

apply the third erasure verification voltage to the selected block directly after applying the effective erasure voltage each time within preset times, and according to the erasure verification result corresponding to the third erasure verification voltage, determine the effective erasure voltage to be applied, in a first subsequent time, to the selected block;

apply the plurality of different erasure verification voltages to the selected block after applying the effective erasure voltage each time beyond the preset times; and based on a plurality of the erasure verification results corresponding to the plurality of different erasure verification voltages, determine the effective erasure voltage to be applied, in a second subsequent time, to the selected block.

11. The memory device of claim 3, wherein the peripheral circuit is further configured to:

apply the second erasure verification voltage to the selected block when the first erasure verification result fails; and apply the third erasure verification voltage to the selected block when the second erasure verification result fails.

12. The memory device of claim 3, wherein the first voltage increment is a step voltage.

13. A memory system, comprising:

one or more memory devices, comprising:

a memory cell array comprising a plurality of blocks; and a peripheral circuit coupled to the memory cell array and configured to:

apply a plurality of different erasure verification voltages to a selected block among the plurality of blocks after applying a first effective erasure voltage to the selected block;

determine a preset duration from among a plurality of preset durations for applying a second effective erasure voltage to the selected block according to a plurality of erasure verification results corresponding to the plurality of different erasure verification voltages, the second effective erasure voltage being greater than the first effective erasure voltage; and apply the second effective erasure voltage to the selected block based on the preset duration; and a memory controller coupled to the memory devices and controlling the memory devices.

14. A method of operating a memory device, comprising:

applying a plurality of different erasure verification voltages to a selected block of the memory device after applying a first effective erasure voltage to the selected block;

determining a preset duration from among a plurality of preset durations for applying a second effective erasure voltage to the selected block according to a plurality of erasure verification results corresponding to the plurality of different erasure verification voltages; and applying the second effective erasure voltage to the selected block based on the preset duration, wherein the second effective erasure voltage is greater than the first effective erasure voltage.

15. The method of claim 14, wherein:

the plurality of different erasure verification voltages comprise three different erasure verification voltages, and the plurality of erasure verification results comprise three erasure verification results.

16. The method of claim 15, wherein:

the three different erasure verification voltages comprise:

a first erasure verification voltage, a second erasure verification voltage, and a third erasure verification voltage whose voltage values increase sequentially, and the first erasure verification voltage, the second erasure verification voltage and the third erasure verification voltage respectively correspond to a first erasure verification result, a second erasure verification result and a third erasure verification result, and the method further comprises:

when the first erasure verification result fails and the second erasure verification result is successful, determining that a voltage value of the second effective erasure voltage is increased by a first voltage increment a voltage value of the first effective erasure voltage;

when the second erasure verification result fails and the third erasure verification result is successful, determining that the voltage value of the second effective erasure voltage is increased by a second voltage increment based on the voltage value of the first effective erasure voltage; and when the third erasure verification result fails, determining that the voltage value of the second effective erasure voltage is increased by a third voltage increment based on the voltage value of the first effective erasure voltage, the third voltage increment is greater than the second voltage increment, and the second voltage increment is greater than the first voltage increment.

17. The method of claim 16, wherein:

the block comprises a drain terminal and a source terminal, the source terminal being provided with a source line and a source select gate, and the method further comprises:

applying a pulse corresponding to a first erasure voltage to the source line of the selected block;

during a voltage of the source line rising to the first erasure voltage, applying a first voltage to the source select gate of the selected block and float the source select gate after another preset duration; and during the voltage of the source line being stabilized at the first erasure voltage, stabilizing a voltage of the source select gate at a second voltage, the second voltage being lower than the first erasure voltage, and the difference between the first erasure voltage and the second voltage constituting the second effective erasure voltage; and the voltage value of the second effective erasure voltage is proportional to a length of the preset duration.

18. The method of claim 17, further comprising:

when the first erasure verification result fails and the second erasure verification result is successful, determining that the preset duration is a first duration;

when the second erasure verification result fails and the third erasure verification result is successful, determining that the preset duration is a second duration; and when the third erasure verification result fails, determining that the preset duration is a third duration, wherein the first duration is shorter than the second duration, and the second duration is shorter than the third duration.

19. The method of claim 16, wherein:

the block comprises a drain terminal and a source terminal, the source terminal being provided with a source line, the block comprises a plurality of word lines located between the drain terminal and the source terminal, the method further comprises:

applying a second erasure voltage to the source line of the selected block, and applying a first voltage to all word lines of the selected block, a difference between the second erasure voltage and the first voltages constituting the second effective erasure voltage, and

a voltage value of the second effective erasure voltage is proportional to a voltage value of the second erasure voltage.

20. The method of claim 16, further comprising:

performing an erase operation on the selected block by applying a gradually increasing an effective erasure voltage multiple times;

applying the third erasure verification voltage to the selected block directly after applying the effective erasure voltage each time within preset times, and according to the erasure verification result corresponding to the third erasure verification voltage, determining the effective erasure voltage to be applied, in a first subsequent time, to the selected block;

applying the plurality of different erasure verification voltages to the selected block after applying the effective erasure voltage each time beyond the preset times; and based on a plurality of the erasure verification results corresponding to the plurality of different erasure verification voltages, determining the effective erasure voltage to be applied, in a second subsequent time, to the selected block.

* * * * *